(12) United States Patent
Klehn et al.

(10) Patent No.: US 6,614,243 B2
(45) Date of Patent: Sep. 2, 2003

(54) MEASUREMENT PROBE FOR DETECTING ELECTRICAL SIGNALS IN AN INTEGRATED SEMICONDUCTOR CIRCUIT

(75) Inventors: Bernd Klehn, München (DE); Juergen Lindolf, Friedberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/947,295

(22) Filed: Sep. 5, 2001

(65) Prior Publication Data

US 2002/0084791 A1 Jul. 4, 2002

(30) Foreign Application Priority Data

Sep. 5, 2000 (DE) .......................................... 100 43 731

(51) Int. Cl.[7] .............................................. G01R 31/302
(52) U.S. Cl. ..................... 324/750; 324/158.1; 324/765
(58) Field of Search ................................. 324/750, 751, 324/752, 753, 754, 757, 758, 761, 762, 765; 250/306, 307; 346/139 C

(56) References Cited

U.S. PATENT DOCUMENTS

| | | | | |
|---|---|---|---|---|
| 5,166,520 A | * | 11/1992 | Prater et al. ................ 250/306 |
| 5,319,977 A | * | 6/1994 | Quate et al. ................... 73/606 |
| 5,488,305 A | * | 1/1996 | Bloom et al. ................ 324/537 |
| 5,892,223 A | * | 4/1999 | Karpov et al. ............... 250/306 |
| 6,057,547 A | * | 5/2000 | Park et al. ................... 250/307 |
| 6,091,248 A | * | 7/2000 | Hellemans et al. ......... 324/719 |

FOREIGN PATENT DOCUMENTS

| | | |
|---|---|---|
| DE | 691 18 319 T 2 | 5/1992 |
| DE | 196 48 475 A 1 | 6/1997 |
| DE | 199 01 210 A 1 | 7/2000 |

* cited by examiner

Primary Examiner—Kamand Cuneo
Assistant Examiner—Tung X. Nguyen
(74) Attorney, Agent, or Firm—Laurence A. Greenberg; Werner H. Stemer; Ralph E. Locher

(57) ABSTRACT

A measurement probe for detecting electrical signals in an integrated circuit on a semiconductor chip has a lever arm and a probe tip which is configured on the lever arm. The lever arm is made of a highly conductive material that is covered by an extremely thin insulator layer. The probe tip has a window in the insulator layer at the apex point, and the lever arm makes contact through the insulator layer. This measurement probe can be operated in a force mode and in a tunneling mode, in order to move to a measurement point on the integrated circuit with high positioning accuracy, and to detect the electrical signals at this measurement point.

11 Claims, 1 Drawing Sheet

MEASUREMENT PROBE FOR DETECTING ELECTRICAL SIGNALS IN AN INTEGRATED SEMICONDUCTOR CIRCUIT

BACKGROUND OF THE INVENTION

Field of the Invention

The invention relates to a measurement probe for detecting electrical signals in an integrated circuit on a semiconductor chip, to a measurement system having such a measurement probe, to a method for producing the measurement probe, and to a method of using the probe.

The enormous progress in the field of semiconductor technology in the last 20 years has led to increasingly more complex integrated circuits being produced in an increasingly smaller space on semiconductor chips. The increasing integration density of switching elements and their connections has, however, also considerably increased the requirements of the test facilities used for functionally analyzing the integrated circuits on the semiconductor chips. In order to allow effective functional analysis of integrated circuits on semiconductor chips to be carried out, for example, in the course of a final inspection of the chips, it is necessary to measure electrical signals at various points on the chip, for example, on different interconnects or transistor inputs. This requires a measurement apparatus which is distinguished by high-precision position resolution. Furthermore, in order to allow even very weak electrical signals to be detected in integrated circuits, it is necessary to use measurement probes with a very low capacitance. Such probes should also be able to follow voltage fluctuations with little noise.

Normally, integrated circuits on semiconductor chips are tested by means of measurement systems that have measurement probes with very fine measurement tips. The measurement tips are moved over the sample surface by means of a computer-aided movement system in order to then be placed on the desired measurement point in the integrated circuit. With the very fine measurement tips that are known, the radius at the tip is only approximately 0.2 µm, so that it is possible to measure interconnects down to less than such a width. In this case, the conventional measurement systems have a capacitance of approximately 20 to 40 fF, and this makes it possible to measure the electronic signals which are normally used in integrated circuits.

However, in the meantime, the progress in semiconductor technology, in particular in MOS technology, now allows the production of components in the sub-0.2 µm range. Furthermore, increasingly smaller electric currents are used for switching the components. This therefore necessitates measurement systems for functional analysis, which can record electrical signals in integrated circuits on semiconductor chips with virtually no capacitance and with extremely high position resolution.

Recently, scanning sensor microscopy has been used for nondestructive mapping and measurement of the topography or structure of semiconductor chips. The best known scanning sensor microscopes are in this case the scanning tunnel microscope and the scanning force microscope. Scanning tunnel microscopes (STM) can be used to scan the surfaces of electrically conductive solid bodies. This is done by moving an extremely fine metal tip over the sample surface at a distance of about 1 nm, by means of a computer-controlled piezoelectric movement system. In this case, a tunneling current occurs between the sample surface and the metal tip. This tunneling current which is carried by overlapping paths of the outermost tip electrons and of the surface electrons, changes by orders of magnitude when the distance between the metal tip and the surface is varied even only to a minimal extent. This system sensitivity to distance changes therefore allows the piezoelectric movement system to keep this distance constant with very high precision while the metal tip scans the surface. Surface topographies of electrically conductive samples can therefore be recorded with atomic resolution.

The scanning force microscope has been developed in order to allow the topography or structure of even sample surfaces that are not conductive to be mapped and measured with atomic position and depth resolution. In scanning force microscopes, the sample surface is likewise scanned with a very fine tip, which is attached to an extremely thin lever arm, by means of piezoelectric movement. The lever arm, with its tip, is in this case moved to a position sufficiently close to the sample surface that an atomic interaction occurs between the outer atoms of the probe tip and the sample surface. A computer then controls the piezoelectric movement system, such that the forces between the probe tip and the sample surface, which are typically between $10^{-5}$ and $10^{-11}$ N, remain constant. When scanning the sample, the probe tip records the topography of the sample surface in the process. The deflection of the lever arm can be registered by a photodiode, for example, by means of a light pointer. A three-dimensional map of the surface geometry can then be produced with atomic resolution, with computer assistance, from the defined movement of the sample tip. As explained, scanning sensor microscopes have admittedly already been used for measuring the topography of semiconductor chips. However, no scanning sensor microscope is known which is used for functional testing of integrated circuits on semiconductor chips for industrial manufacturing purposes.

SUMMARY OF THE INVENTION

It is accordingly an object of the invention to provide a measurement probe that can be used for functionally analyzing electrical circuits on a semiconductor chip which overcomes the above-mentioned disadvantageous of the prior art apparatus of this general type. It is also an object of the invention to provide a measurement system that includes the measurement probe and a method for producing such a measurement probe. In particular, it is an object of the invention to provide such a measurement system, by means of which, electrical signals in integrated circuits can be measured with extremely fine position resolution and in a virtually uninfluenced manner.

With the foregoing and other objects in view there is provided, in accordance with the invention, a measurement probe for detecting electrical signals in an integrated circuit on a semiconductor chip. The measurement probe includes a lever arm having a probe tip that is arranged on it. The lever arm and the probe tip are composed of a highly conductive material which is covered by an extremely thin insulator layer. The probe tip has a window in the insulator layer on its front radius, and contact is made with the lever arm through the insulator layer. Such a measurement probe can be operated first in a force mode, in order to detect the topology of the circuit by scanning the surface of the integrated circuit, in order to fix the probe tip above the desired measurement point, and then, in a tunneling mode, in order to determine the voltage at the measurement point in the integrated circuit by detecting a tunneling current between the measurement point and the probe tip.

The measurement probe for detecting electrical signals in an integrated circuit thus represents a combination of a scanning force microscope and a scanning tunnel microscope, with extremely fine position resolution down to the atomic range being feasible in the scanning force mode. The measurement probe can therefore be moved exactly to the desired measurement point on the integrated circuit, for example precisely on the center of an interconnect. In the tunneling mode, the electrical signals at the measurement point can then be measured very accurately, without these signals being influenced. The capacitance of the probe tip is in this case only about 1/10 to 1/100 of that of conventional measurement tips.

With the foregoing and other objects in view there is provided, in accordance with the invention, a method for producing the measurement probe. The measurement probe is produced from highly doped, monocrystalline silicon, which is thermally oxidized in order to produce an oxide layer with a thickness of at most 3 nm, preferably 2 nm. A window is opened in the oxide layer at the front radius of the probe tip, and electrical contact is made with the lever arm through the oxide layer. A measurement probe produced in such a way reliably allows probe tips with a radius of curvature of less than 20 nm to be produced, in which case the probe can be used both in the force mode and in the tunneling mode. The thermal oxide formation in this case ensures a mechanically robust oxide layer, in order to allow both the force mode and the tunneling mode to be carried out.

With the foregoing and other objects in view there is also provided, in accordance with the invention, a method of using a measurement probe to measure electrical voltages in an integrated circuit on a semiconductor chip that includes providing a measurement probe with: a lever arm, and a probe tip that is located on the lever arm. The lever arm and the probe tip are made of a highly conductive material that is covered by an extremely thin insulator layer. The probe tip has an apex point at which a window is formed in the insulator layer. The lever arm is contacted through the insulator layer. The method also includes steps of: operating the measurement probe in a force mode to detect a topology of an integrated circuit by scanning a surface of the integrated circuit, in order to set the probe tip above a desired measurement point; and subsequently, operating the measurement probe in a tunneling mode, to detect electrical signals at the measurement point in the integrated circuit by measuring a tunneling current between the measurement point and the probe tip.

With the foregoing and other objects in view there is also provided, in accordance with the invention, a measurement system for detecting electrical signals in an integrated circuit on a semiconductor chip. The measurement system includes a measurement probe that operates in a force mode and in a tunneling mode. The measurement probe includes: a lever arm, and a probe tip that is located on the lever arm. The probe tip and the lever arm are made of a highly conductive material that is covered by an extremely thin insulator layer. The probe tip has an apex point at which a window is formed in the insulator layer. The lever arm includes a contact going through the insulator layer and contacting the highly conductive material. The measurement system also includes a light pointer detector system for detecting bending of the lever arm when the measurement probe is operating in the force mode, and an X-Y-Z adjustment table for moving the semiconductor chip underneath the probe tip in a X direction and in a Y direction. The light pointer detector system provides a measurement signal that is used to maintain a constant distance between the probe tip and the integrated circuit of the semiconductor chip. The measurement system also includes a voltage supply that is connected to the contact on the lever arm. The voltage supply is provided for applying an electrical potential between the integrated circuit and the probe tip in order to produce a tunneling current when the measurement probe is operating in the tunneling mode. A current measurement device is provided for detecting the tunneling current.

Other features which are considered as characteristic for the invention are set forth in the appended claims.

Although the invention is illustrated and described herein as embodied in Measurement probe for detection of electrical signals in an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
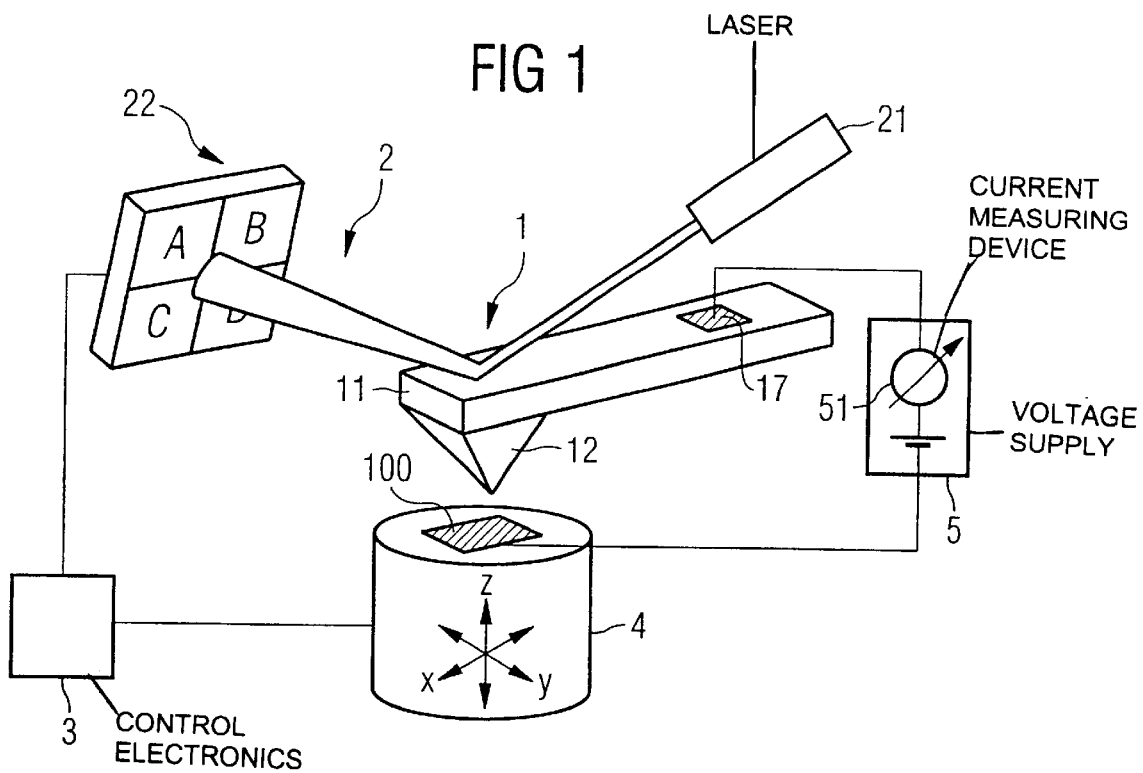
FIG. 1 schematically shows a measurement system.
Figure 2:
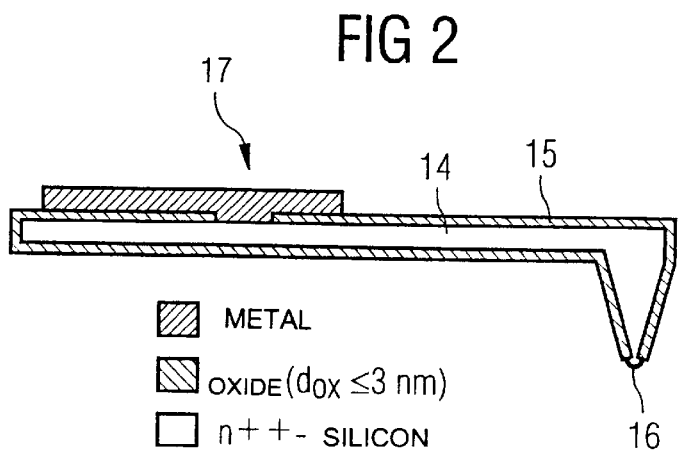
FIG. 2 shows a cross section of a measurement probe.

Referring now to the figures of the drawing in detail and first, particularly, to FIG. 1 thereof, there is schematically shown a measurement system that represents a type of scanning sensor microscope, in which a scanning force mode is combined with a tunneling mode. The essential element of the measurement system is a measurement probe 1, which is formed from a soft leaf spring, a cantilever 11, and a sensor or probe tip 12 fitted to it. FIG. 2 shows a cross section through the measurement probe, which is preferably manufactured from monocrystalline silicon 14 that is extremely highly doped so that its resistivity is less than 0.02 ohms/cm.

The measurement probe 1 is in this case preferably designed using microstructuring technology such that the probe tip 12 is in the form of a pyramid with a polygonal base surface. The height of the probe tip is in this case in the range from 10 to 15 $\mu$m, with the cone angle of the tip being between 40° and 60°. The probe tip 12 is also rounded in the front region. The radius is in this case extremely small, with a value of less than 20 nm.

The cantilever 11, to which the probe tip 12 is fitted, is essentially in the form of a flat plate. As can also be seen from the cross section in FIG. 2, the basic shape 14 of the measurement probe 1, which is composed of monocrystalline, highly-doped silicon, is coated with an oxide layer 15, whose thickness is at most 3 nm and preferably 2 nm. This oxide layer 15 is preferably produced thermally, thus forming a mechanically robust oxide. A window 16 is provided in the oxide 15 on the front, rounded apex point of the probe tip 12, and is formed by lithography. This window 16 in the oxide layer 15 is preferably round, with a maximum diameter of 10 nm. A further opening is provided in the oxide on the top face of the cantilever 11, through which a metal layer 17 makes contact with the highly doped, monocrystalline basic silicon shape 14 of the probe.

In addition to the measurement probe 1, the measurement system has a light pointer detector system 2, which consists of a laser 21 and a photodiode 22. The laser 21 and the photodiode 22 are in this case arranged such that the beam of the laser 21 is reflected from the rear face of the cantilever 11 in the region of the probe tip 12 onto the photodiode 22. This arrangement makes it possible to define any bending of the cantilever 11 accurately. The measurement signal from the photodiode 22 is transmitted to control electronics 3, which control an X-Y-Z adjustment table 4, on which a semiconductor chip 100 which is to be measured is located.

The metal layer 17 on the rear face of the cantilever 11 of the measurement probe 1 is furthermore connected to a voltage supply 5, which is at the same time connected to the integrated circuit to be measured that is on the semiconductor chip 100. Furthermore, the voltage supply 5 has a highly sensitive current measurement device 51 which allows any current flowing between the measurement probe 1 and the integrated circuit to be measured.

The measurement system shown in FIG. 1 makes it possible to carry out functional analysis of integrated circuits on semiconductor chips in which extremely fine measurement point position resolution is achieved, and electrical signals can be measured virtually without any influence. In a first step for this purpose, the semiconductor chip 100 to be tested is placed on the X-Y-Z adjustment table 4. In a second step, the topology of the integrated circuit on the semiconductor chip 100 is then detected using a force mode, and the measurement probe 1 is moved above the desired measurement point. In the force mode, the probe tip 12 of the measurement probe 1 is moved to a point so close to the surface of the semiconductor chip 100 that an atomic interaction occurs between the outer atoms of the probe tip and the atoms on the surface of the semiconductor chip 100. The force acting between the probe tip 12 and the semiconductor chip 100 in this case results in the cantilever 11 of the measurement probe 1 bending. This bending of the cantilever 11 is measured by the deflection of the beam of the laser 21 on the rear face of the cantilever 11, via the photodiode 22. The measured deflection is passed on from the photodiode 22 as a measurement signal to the control electronics 3, which control the height position (Z-direction) of the X-Y-Z adjustment table with the aid of piezoelectric control elements, such that the force, that is to say the distance between the probe tip 12 and the surface of the semiconductor chip 100, remains constant.

If the semiconductor chip 100 together with the integrated circuit is now scanned in the X-Y plane by means of the piezoelectric control elements of the adjustment table 4, and the Z-position of the adjustment table, which reproduces a constant distance between the probe tip and the sample, is recorded by the control electronics 3, a three-dimensional image of the chip surface, and hence of the integrated circuit is obtained, with position resolution down to the atomic range. The topography of the integrated circuit recorded by the measurement system is in this case compared continuously in the control electronics 3 with the predetermined circuit design of the integrated circuit. When the desired measurement point on the integrated circuit is reached, the scanning field size of the adjustment table 4 is set to zero, and the probe tip 12 is then locked above the desired measurement point on the integrated circuit. Since the position resolution in the force mode is extremely fine, it is possible in the process to move the sensor tip 12, for example, precisely to the center of an interconnect whose width is in the sub-micrometer range.

Once the probe tip 12 has been placed above the measurement point on the integrated circuit, in the force mode, the measurement system is then switched from the force mode to a tunneling mode. In the tunneling mode, a defined electrical potential is applied between the measurement probe 1 and the integrated circuit on the semiconductor chip 100 to produce a tunneling current between the probe tip 12 of the measurement probe 1 and the measurement point, located underneath it, in the integrated circuit. The tunneling current is in this case carried by the overlapping paths of the outermost electrons in the highly doped basic silicon form 14 at the apex point of the probe tip 12 in the exposed oxide window 16, and the electrons at the measurement point in the integrated circuit. Voltage fluctuations at the measurement point now influence this tunneling current between the probe tip 12 and the measurement point, and can be detected via the highly sensitive current measurement device 51. The capacitance of the measurement probe 1 is in this case less than 1 fF, so that the voltage at the measurement point can be determined using the current measurement device 51, virtually without any influence.

This measurement signal from the current measurement device 51 can then be evaluated for functionally analyzing the integrated circuit. After this, the procedure described above can be repeated, in order to move the measurement probe 1 to another measurement point, in order to allow a further electrical signal to be recorded there, for functionally analyzing the integrated circuit. The invention thus makes it possible to carry out a functional analysis of integrated circuits with extremely high position resolution, even in the sub-micrometer range, with even very weak electrical signals being detected and enables the capability to follow voltage fluctuations with low noise at the same time.

The features of the invention disclosed in the above description, the drawings and the claims may be important to the implementation of the various embodiments of the invention both individually and in any desired combination.

We claim:

1. A measurement probe for a scanning sensor microscope with a combined force-tunnel mode for detecting electrical signals in an integrated circuit on a semiconductor chip, comprising:
   a lever arm; and
   a probe tip located on said lever arm, said probe tip having a radius of curvature of less than 20 nm;
   said probe tip and said lever arm made of a highly conductive material that is covered by an extremely thin insulator layer, said insulator layer having a thickness being not greater than 3 nm;
   said probe tip having an apex point at which a window is formed in said insulator layer, said window having a diameter being not more than 10 nm; and
   said lever arm being contacted through said insulator layer.

2. The measurement probe according to claim 1, wherein said highly conductive material is highly doped, monocrystalline silicon, and said insulator layer is a silicon oxide layer.

3. The measurement probe according to claim 2, wherein said silicon oxide layer has a thickness that is not greater than 3 nm.

4. The measurement probe according to claim 2, wherein said silicon oxide layer has a thickness that is not greater than 2 nm.

5. The measurement probe according to claim 1, wherein said probe tip has a radius of curvature that is at most 20 nm.

6. A method of using a measurement probe to measure electrical signals in an integrated circuit on a semiconductor chip, which comprises:

providing a measurement probe for a scanning sensor microscope with a combined force-tunnel mode for detecting the electrical signals in the integrated circuit, the measurement probe including:
- a lever arm, and
- a probe tip located on the lever arm, the probe tip having a radius of curvature of less than 20 nm,
- the probe tip and the lever arm made of a highly conductive material that is covered by an extremely thin insulator layer, the insulator layer having a thickness being not greater than 3 nm,
- the probe tip having an apex point at which a window is formed in the insulator layer, the window having a diameter being not more than 10 nm, and
- the lever arm being contacted through the insulator layer;

operating the measurement probe in a force mode to detect a topology of the integrated circuit by scanning a surface of the integrated circuit, in order to set the probe tip above a desired measurement point; and subsequently, operating the measurement probe in a tunneling mode, to detect electrical signals at the measurement point in the integrated circuit by measuring a tunneling current between the measurement point and the probe tip.

7. A method for producing a measurement probe, which comprises:
   producing a lever arm and a probe tip having an apex point by microstructuring a highly conductive material, the probe tip having a radius of curvature of less than 20 nm;
   coating the highly conductive material with a thin insulator layer having a thickness not greater than 3 nm;
   forming a window having a diameter of not more than 10 nm in the insulator layer at the apex point of the probe tip; and
   contacting the lever arm through the insulator layer.

8. The method according to claim 7, which comprises forming the insulator layer with a window through which the lever arm contacts the highly conductive material.

9. The method according to claim 7, which comprises:
   providing the highly conductive material as highly doped, monocrystalline silicon; and
   providing the insulator layer by thermally oxidizing the conductive material to produce a silicon oxide layer having a thickness that is not greater than 3 nm.

10. The method according to claim 7, which comprises:
    providing the highly conductive material as highly doped, monocrystalline silicon; and
    providing the insulator layer by thermally oxidizing the conductive material to produce a silicon oxide layer having a thickness that is not greater than 2 nm.

11. A measurement system for detecting electrical signals in an integrated circuit on a semiconductor chip comprising:
    a measurement probe for a scanning sensor microscope with a combined force-tunnel mode for detecting the electrical signals in the integrated circuit, said measurement probe including:
    - a lever arm, and
    - a probe tip located on said lever arm, said probe tip having a radius of curvature of less than 20 nm,
    - said probe tip and said lever arm made of a highly conductive material that is covered by an extremely thin insulator layer, said insulator layer having a thickness being not greater than 3 nm
    - said probe tip having an apex point at which a window is formed in said insulator layer, said window having a diameter being not more than 10 nm, and
    - said lever arm being contacted through said insulator layer;

a light pointer detector system for detecting bending of said lever arm when said measurement probe is operating in the force mode;

an X-Y-Z adjustment table for moving the semiconductor chip underneath the probe tip in a X direction and in a Y direction, said light pointer detector system providing a measurement signal that is used to maintain a constant distance between said probe tip and the integrated circuit of the semiconductor chip;

a voltage supply that is connected to said contact on said lever arm, said voltage supply provided for applying an electrical potential between the integrated circuit and said probe tip in order to produce a tunneling current when said measurement probe is operating in the tunneling mode; and a current measurement device for detecting the tunneling current.

* * * * *